US008765520B2

(12) United States Patent
Dowling et al.

(10) Patent No.: US 8,765,520 B2
(45) Date of Patent: Jul. 1, 2014

(54) METHODS OF MANUFACTURING PHOTOVOLTAIC ELECTRODES

(75) Inventors: Denis Dowling, Blackrock (IE); Mohamed Awais, Dublin (IE)

(73) Assignees: National University of Ireland, Dublin (IE); University College Dublin, Dublin (IE)

( * ) Notice: Subject to any disclaimer, the term of this patent is extended or adjusted under 35 U.S.C. 154(b) by 0 days.

(21) Appl. No.: 13/820,703

(22) PCT Filed: Sep. 7, 2011

(86) PCT No.: PCT/EP2011/065494
§ 371 (c)(1),
(2), (4) Date: Apr. 30, 2013

(87) PCT Pub. No.: WO2012/032092
PCT Pub. Date: Mar. 15, 2012

(65) Prior Publication Data
US 2013/0224907 A1    Aug. 29, 2013

(30) Foreign Application Priority Data

Sep. 7, 2010  (IE) .................................. S2010/0550
Mar. 16, 2011  (IE) .................................. S2011/0125

(51) Int. Cl.
*H01L 21/00*   (2006.01)
(52) U.S. Cl.
USPC .............................................. 438/98; 438/85
(58) Field of Classification Search
USPC ........................................................ 438/98, 85
See application file for complete search history.

(56) References Cited

U.S. PATENT DOCUMENTS

| 6,075,203 A * | 6/2000 | Wang et al. ................. 136/256 |
| 2003/0150485 A1 * | 8/2003 | Koyanagi et al. ............. 136/256 |
| 2006/0127562 A1 | 6/2006 | Lewis et al. |
| 2007/0003743 A1 * | 1/2007 | Asano et al. ................. 428/201 |
| 2007/0120178 A1 * | 5/2007 | McGregor et al. ............ 257/321 |
| 2009/0142590 A1 * | 6/2009 | Tan et al. ..................... 428/336 |
| 2009/0166055 A1 * | 7/2009 | Guiheen et al. ............ 174/126.1 |
| 2010/0084776 A1 * | 4/2010 | Murozono et al. ............... 264/5 |

FOREIGN PATENT DOCUMENTS

| JP | 2003-308893 | * 4/2002 |
| JP | 2003308893 A | 10/2003 |

OTHER PUBLICATIONS

Uchida S et al, "Preparation of TiO2 nanocrystalline electrode for dye-sensitized solar cells by 28 GHz microwave irradiation", Solar Energy Materials and Solar Cells, Elsevier Science Publishers, Amsterdam, NL vol. 81, No. 1, Jan. 25, 2004, pp. 135-139, XP004482769, ISSN: 0927-0248, DOI: 10.1016/J.Solmat, 2003-08-0.20 the whole document.

(Continued)

*Primary Examiner* — Karen Kusumakar
(74) *Attorney, Agent, or Firm* — Christopher & Weisberg, P.A.

(57) ABSTRACT

A photovoltaic electrode is made by the following steps: (a) depositing on a substrate a dispersion comprising powdered semiconductor particles in a dispersion medium; (b) removing the majority of the dispersion medium to leave the powdered semiconductor particles in a deposition layer on the substrate; (c) creating a plasma using microwave energy excitation; (d) exposing the deposition layer to said microwave-excited plasma for a sufficient time to sinter the nanoparticles thereby adhering them to the substrate; and (e) absorbing a dye into said sintered deposition layer. The electrode thus obtained exhibits improved performance relative to conventional sintered electrodes.

26 Claims, 11 Drawing Sheets

(56) References Cited

OTHER PUBLICATIONS

J. He, H. Lindstrom, A Hagfeldt, S.E. Lindquist, "Dye-Sensitized Nanostructured Tandem Cell-First Demonstrated Cell With a Dye-Sensitized Photocathode", Solar Energy Materials and Solar Cells, vol. 62, 2000, pp. 265-273, XP002681640, the whole document.
International Search Report and Written Opinion dated Sep. 3, 2012 for the International Application No. PCT/EP2011/065494, International Filing Date Sep. 7, 2011 (consisting of 14 pages).
Saitou K. et al, "Microwave sintering of iron, cobalt, nickel, copper and stainless steel powders", Scripta Materialia, Elsevier, Amsterdam, NL, vol. 54, No. 5, Mar. 1, 2006, pp. 875-879.
Pasquier A. et al, "An approach to laminated flexible Dye sensitized solar cells", Electrochimica Acta, Elsevier Science Publishers, Barking, GB, vol. 52, No. 26, Aug. 10, 2007, pp. 7469-7474.
Zhang D. et al, "Low-Temperature Fabrication of Efficient Porous Titania Photoelectrodes by Hydrothermal Crystallization at the Solid/Gas Interface", Advanced Materials, Wiley VCH Verlag, DE, May 16, 2003, pp. 814-817.
Zhang D. et al, "Room-Temperature Synthesis of Porous Nanoparticulate TiO2 Films for Flexible Dye-Sensitized Solar Cells", Advanced Functional Materials, Wiley-VCH Verlag GmbH & Co. KGAA, DE, vol. 16, No. 9, Jun. 6, 2006, pp. 1228-1234.

* cited by examiner

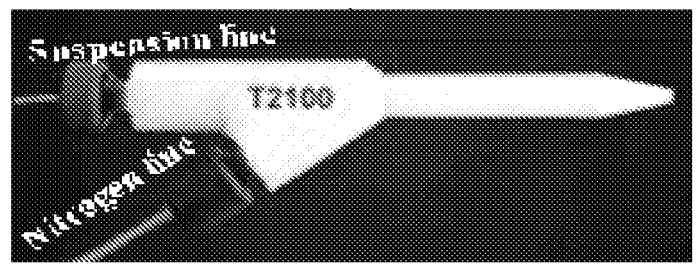
Fig. 11
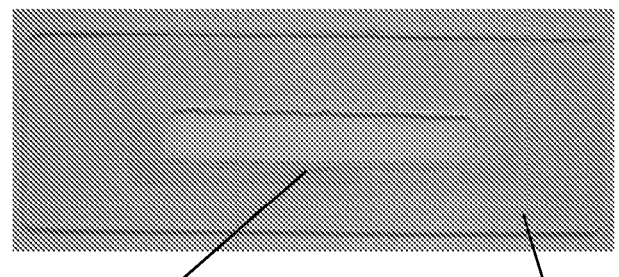
Fig. 12    TiO2 coating on ITO-PEN    1 mm thick glass cover
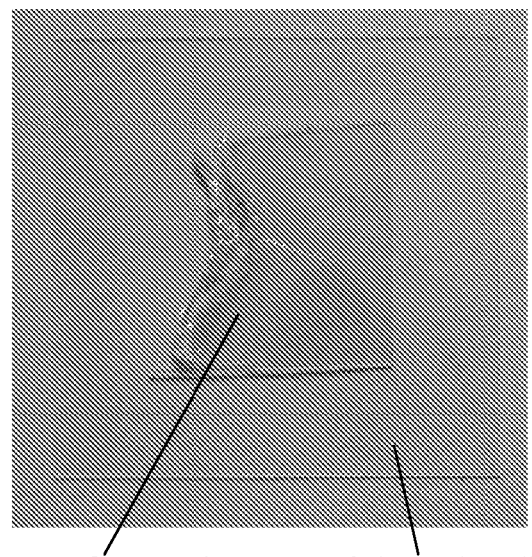
Fig. 13    ITO-PEN substrate    0.5 mm glass slide holder

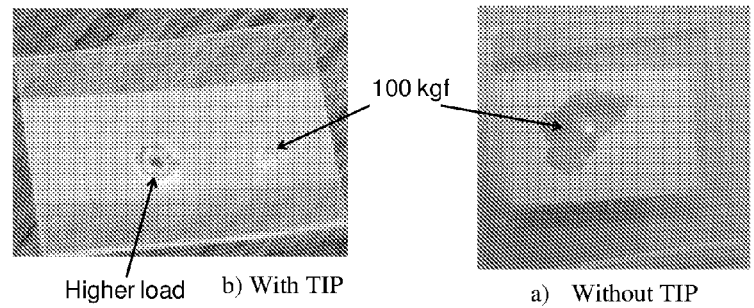
Fig. 14a, b
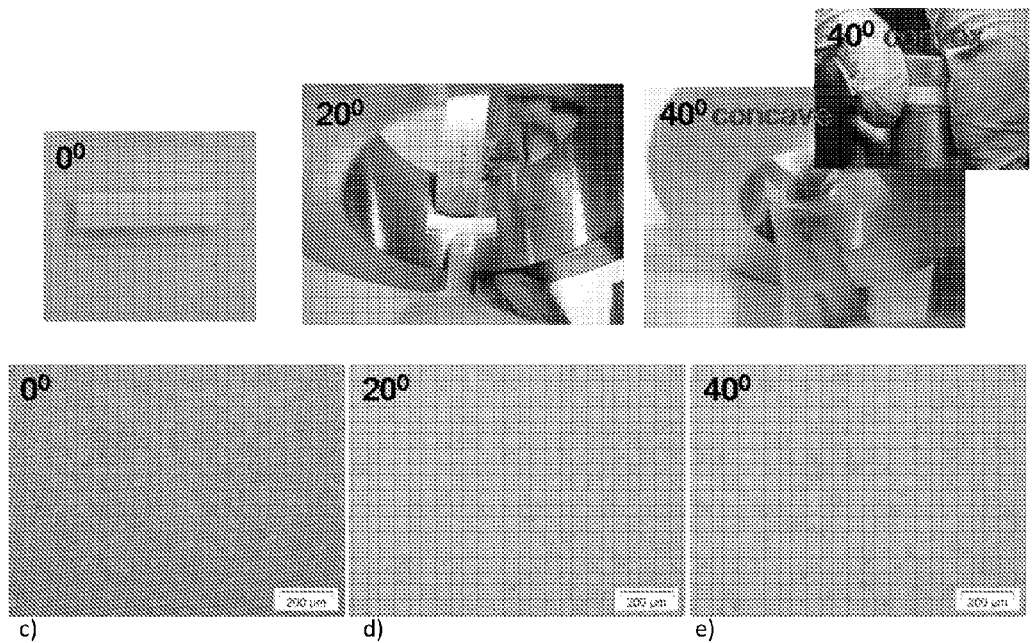
Fig. 14 c, d and e

As – deposited coating. Inset image highlight micro-cracks

Microwave plasma sintered for 5 min

METHODS OF MANUFACTURING PHOTOVOLTAIC ELECTRODES

CROSS-REFERENCE TO RELATED APPLICATIONS

This application is a Submission Under 35 U.S.C. §371 for U.S. National Stage Patent Application of International Application Number: PCT/EP2011/065494, filed Sep. 7, 2011 entitled "METHODS OF MANUFACTURING PHOTOVOLTAIC ELECTRODES," which claims priority to Irish Patent Application Serial No: S2010/0550, filed Sep. 7, 2010, and Irish Patent Application Serial No: S2011/0125, filed Mar. 16, 2011 the entirety of both which are incorporated herein by reference.

TECHNICAL FIELD

This invention relates to the manufacture of photovoltaic electrodes, and in particular to the manufacture of dye-sensitized solar cells.

BACKGROUND ART

Dye-sensitized solar cells (DSSCs) show considerable potential as a relatively low cost alternative to silicon based solar cells. These cells were developed by Gratzel and co-workers in 1991 [B. O'Regan, M. Gratzel, Nature, 353 (1991) 737-740] and there is currently a considerable focus on enhancing their light conversion efficiency and stability.

The principal components of a DSSC electrode are a conducting substrate, which is usually a transparent conductive oxide coated on glass, a highly porous layer of semiconductor material, and a photosensitive dye absorbed into and coating the porous semiconductor.

In the case of conventional DSSCs, dye sensitization involves solely the semiconductor anode made of n-type $TiO_2$ nanoparticles. The counter electrode is generally a metallic cathode with no photoelectrochemical activity. To date the highest conversion efficiency obtained of 11% [M. K. Nazeeruddin, F. De Angelis, S. Fantacci, A. Selloni, G. Viscardi, P. Liska, S. Ito, B. Takeru, M. Gratzel, Journal of the American Chemical Society, 127 (2005) 16835-16847], is less than the best silicon based thin-film cells.

A method of further enhancing the light conversion efficiency as suggested by He et al. [J. He, H. Lindström, A. Hagfeldt, S.-E. Lindquist, Solar Energy Materials and Solar Cells, 62 (2000) 265-273] is to substitute the cathode with a dye-sensitized photoactivep-type metal oxide. This tandem dye-sensitized solar cell design utilizes more of the solar spectrum. The efficiency, however of p-type metal oxides is still very low, which limits their effectiveness in tandem DSSCs. Amongst the potential reasons highlighted for the poor conversion efficiency of the cathode within tandem DSSC, the more critical are the inefficient light absorption capability, poor charge injection efficiency and charge transport rate, along with inner resistance.

The most widely used n-type electrode material is nano-structured titanium dioxide. For p-type electrodes, perhaps the most promising technology employs nickel oxide (NiOx) coatings, which has a considerable potential for use as a cathode in tandem cells. This is due to their p-type nature, excellent chemical stability, in addition to well defined optical and electrical properties. Moreover, NiOx is considered as a model semiconductor substrate due to its wide band-gap energy range from 3.6 to 4.0 eV depending on the amount of Ni(III) sites.

NiOx films have been fabricated by various techniques which include spin coating, dipping, electrochemical deposition, magnetron sputtering and sol-gel. With the exception of the sputtering and electrochemical techniques, the other methods require a sintering step in order to obtain dense coatings. Thermal sintering also performs the function of removing the binder in the case of sol gel deposited coatings. Typically sintering conditions of 300-450° C. for 30 to 60 minutes are reported.

A disadvantage with thermal sintering is the processing time. When one adds the heat-up and cool-down times, it can take approximately 4 hours to process a substrate.

Further disadvantages with conventional thermal sintering include the photovoltaic performance of photocathodes produced according to this method and the probably related physical shortcomings of such photocathodes, such as the adhesion between the substrate and the nanoparticular NiOx layer, the post-sintering average particle size, the pore characteristics, and the dye absorption.

The present invention aims to address at least some of these shortcomings and to provide improvements in the manufacture of photovoltaic electrodes.

DISCLOSURE OF THE INVENTION

There is provided a method of manufacturing a photovoltaic electrode, comprising the steps of:

(a) depositing on a substrate a dispersion comprising powdered semiconductor particles in a dispersion medium;

(b) removing the majority of the dispersion medium to leave the powdered semiconductor particles in a deposition layer on the substrate;

(c) creating a plasma using microwave energy excitation;

(d) exposing the deposition layer to said microwave-excited plasma for a sufficient time to sinter the nanoparticles thereby adhering them to the substrate; and (e) absorbing a dye into said sintered deposition layer.

It has been found that one obtains a significantly better electrode using this method when compared to thermal sintering. Improvements have been found in the physical characteristics of the nanoparticle layer, its adhesion and electrical connectivity with the substrate, and the degree of dye absorption. In particular, it is found that the electrodes produced by this method have a surface exhibiting high porosity without sacrificing the mechanical stability of the resulting coatings. This surface morphology ensures higher light absorption by the monolayer of adsorbed dye, while keeping an intimate contact between the particulate material and the dye molecules. This in turn reduces the inner resistance and hence improves the charge injection efficiency.

It is hypothesized that the advantages of the invention can be attributed to a number of factors including the rapidity of heating and the bulk homogeneity of heating due to the materials interacting with "cold" microwaves coupled through a plasma instead of radiant heat in a conventional furnace. This avoids the outer surface "cooking", i.e. a heat-affected outer zone which can hinder dye absorption, and it increases the adhesion between sintered particles and the underlying substrate relative to conventionally sintered electrodes. Details of the results will be given below.

The net result is that electrical properties of the photovoltaic electrodes prepared according to this method are significantly improved (i.e. in some instances ten-fold or more) relative to the equivalent thermal sintered electrodes.

Preferably, step (a) of depositing a deposition layer comprises depositing a layer of said powdered semiconductor particles in a dispersion medium, and removing a majority of said dispersion medium to leave the particles weakly bound to the substrate in a deposition layer.

Preferably, said deposition step is selected from spraying, spin coating and sol gel deposition.

In a preferred embodiment, the dispersion medium is heated before, during or after the deposition step to evaporate the dispersion medium. Preferably, this is done by heating the substrate.

Evaporation may also be achieved without heating by choosing a suitable dispersion medium which evaporates at ambient temperatures.

The method involves removal of the majority of the dispersion medium. More preferable, substantially all of the dispersion medium is removed, so that the deposition layer is a substantially dry layer on the substrate.

Preferably, said powdered semiconductor particles have a maximum particle size of 20 microns.

More preferably, said powdered semiconductor particles have a maximum particle size of 500 nm.

More preferably, said powdered semiconductor particles are nanoparticles with a maximum particle size of 100 nm.

Preferably, said powdered semiconductor particles are metal oxide particles.

The invention has particular application in metal oxide particles such as nickel oxide and titanium dioxide. A further application of this technology is the fabrication of CIGS (copper indium gallium selenide) solar cells if the correct ratio of the different powders is homogeneously mixed.

Particularly advantageous results are found using nickel oxide nanoparticles, and with Erythrosin B dye (2',4',5',7'-tetraiodofluorescein, disodium salt).

Preferably, in step (c), the deposition layer is exposed to said microwave plasma for between 2 and 20 minutes, more preferably between 4 and 15 minutes.

Preferably, the method further comprises the step of depositing on the substrate an adhesion enhancing agent to enhance adhesion between the semiconductor particles and the substrate.

The adhesion enhancing agent is preferably a metal compound which is reactive in the presence of water vapour to form a metal oxide.

Preferably said semiconductor particles comprise the same metal oxide as is formed by the reaction of said metal compound with water vapour.

Preferably, the metal oxide is selected from nickel oxide, titanium dioxide, tin oxide, indium tin oxide and zinc oxide.

Preferably, the metal compound is a metal alkoxide or metal halide of the same metal as is present in said metal oxide with the proviso that the metal alkoxide or metal halide is reactive in the presence of water vapour to form said metal oxide.

Where the metal oxide is titanium dioxide, the compound is preferably selected from the group of titanium tetrachloride, titanium alkoxides (including in particular titanium isopropoxide and titanium butoxide) and precursors thereof Preferably, the adhesion enhancing agent is dispersed in an organic carrier which is substantially free of water. Particularly suitable carriers include isopropanol and tertbutanol.

When the solvent or carrier evaporates, the metal compound reacts with water vapour in the air to form an amorphous layer of metal oxide.

The step of depositing an adhesion enhancing agent preferably occurs prior to step (a) of depositing on the substrate a dispersion comprising powdered semiconductor particles in a dispersion medium. In this way, the dispersion of powdered semiconductor particles is deposited on an intermediate layer of the adhesion enhancing agent.

Alternatively, the adhesion enhancing agent is co-deposited with the semiconductor nanoparticles in the same dispersion medium, such that this step occurs as part of the deposition step (a).

In a further alternative, the adhesion enhancing agent is deposited on the substrate in a first layer together with the semiconductor nanoparticles, following which a layer of semiconductor nanoparticles is deposited without adhesion enhancing agent. Optionally, a sandwich structure of layers can be created by repeating one or more of these depositions (e.g. a three-layer sandwich, or a multi-layer repeating sandwich structure of layers with and without the adhesion enhancing agent.

BRIEF DESCRIPTION OF THE DRAWINGS

The invention will now be further illustrated by the following descriptions of embodiments thereof, given by way of example only with reference to the accompanying drawings, in which:

FIG. 11 shows a nebulizer used for spraying dispersions onto a substrate;

FIG. 12 is a photograph of a sample employing a polymeric substrate and TiO$_2$ coating when held in place with a glass slide on a cooling stage;

FIG. 13 is a photograph of a sample employing a polymeric substrate and TiO$_2$ coating following plasma treatment when an intermediate sample holder is employed between the polymer and the cooling stage;

FIGS. 14a-14e show the results of subjecting samples to Rockwell tests (FIGS. 14a and 14b) and bending tests (FIGS. 14c, 14d and 14e);

DETAILED DESCRIPTION OF PREFERRED EMBODIMENTS

EXAMPLE 1

NiOx Nanoparticles on FTO Glass Substrate

Sample Preparation

In order to prepare photovoltaic electrodes, fluorine doped tin oxide (FTO) glass substrates (3 mm thick) supplied by Mansolar. The glass substrates (2×2 cm) were ultrasonically cleaned in propanol followed by acetone, each for 5 minutes. Other typical substrates which may be used include indium doped tin oxide (ITO) glass and polymers e.g. PET.

A deposition layer medium was made, comprising NiOx nanoparticles (~50 nm) suspended in methanol (20 mg/ml) as a dispersion medium. This deposition layer medium was deposited by spraying using a nebulizer (Burgener Mira Mist atomizer) which uses an inert gas to break up the suspension into small aerosol droplets. In this case, the inert gas used was nitrogen at a flow rate of about 2 liters/min. The nebulizer was moved over the surface of the substrate in a raster pattern using a computer numeric control (CNC) device with a line speed of 20 mm/s and a step interval of 1 mm. The distance from the tube orifice to the substrate was fixed at 10 mm. During deposition, the glass substrates were mounted over a heating block to maintain the substrate temperature at approximately 50 degrees C. The methanol evaporated once deposited to leave a layer of loosely bound NiOx nanoparticles on the substrate.

Samples prepared in this way were subjected to microwave plasma processing as will now be described with reference to FIG. 1. Some comparative tests were done against samples prepared in the same way but subjected to conventional furnace sintering in air using a Carbolite Furnace (RHF 1200).

Microwave Plasma Processing

Figure 1:
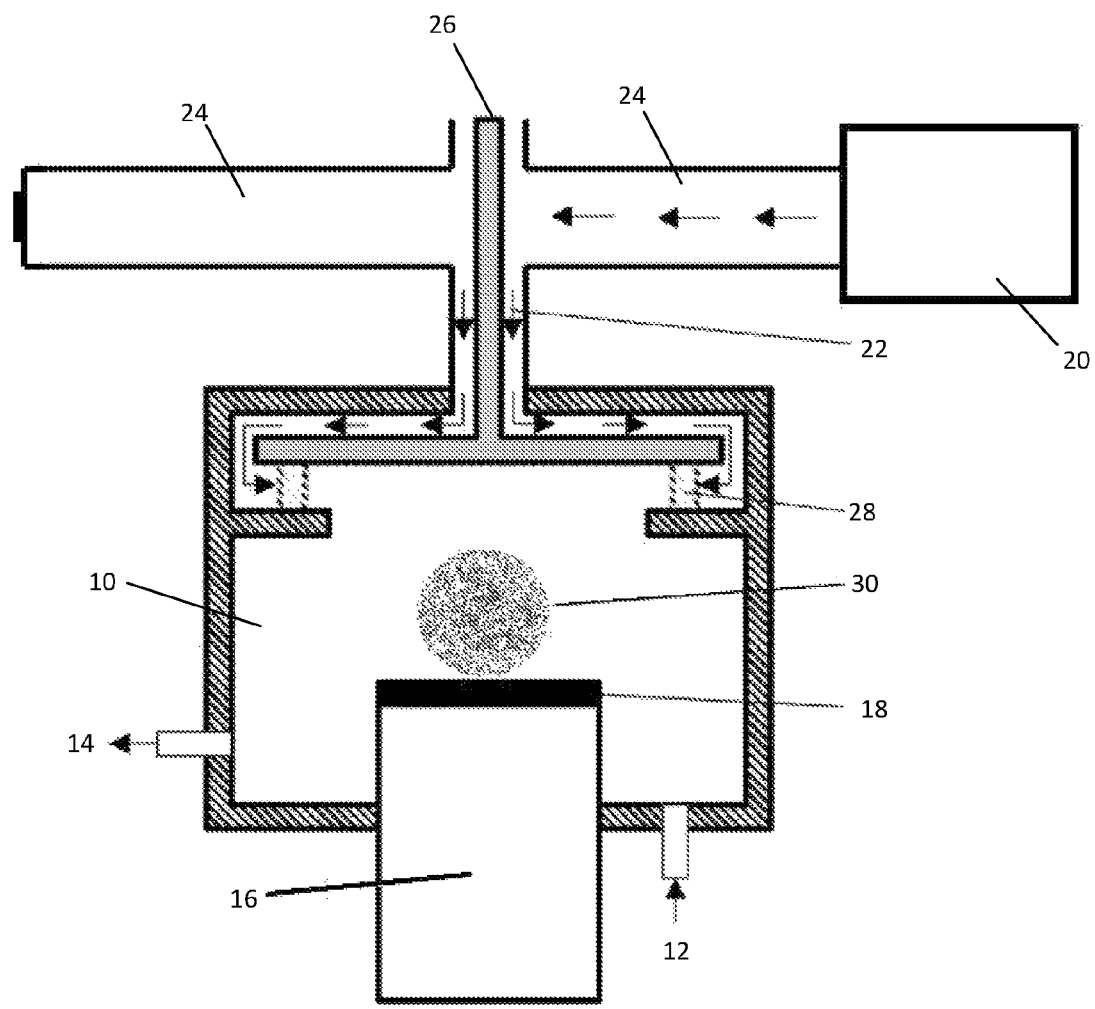
FIG. 1 is a schematic illustration of an apparatus used to manufacture a photovoltaic electrode.

FIG. 1 shows an apparatus used in the manufacture of a photovoltaic electrode, comprising a plasma chamber 10 which is pressure controlled using a gas supply inlet 12 and a vacuum outlet 14. In the processes described below, the pressure was controlled to form a plasma at a pressure of 20 mbar in an argon and oxygen atmosphere in a ratio 10:1 (argon: oxygen).

A sample stage 16 is located within the chamber 10 to support one or more substrates (not shown) upon a sample holder 18 for processing. The sample stage is height-adjustable, rotatable, and is water-cooled. In the set-up used to generate the results described herein, three samples were treated at a time upon the sample holder 18.

A Muegge microwave power supply 20 operating at 2.4 kW and 2.45 GHz provides microwave energy 22 via a tunable waveguide 24 having a tuner 26, through a quartz window 28 into the chamber 10, where it excites a plasma ball 30 located above the sample holder 18.

Substrate temperatures were measured using a LASCON QP003 two-colour pyrometer (not shown) from Dr Merganthaler GmbH & Co.

Sample Characterisation

The NiOx film thickness was measured by step height measurement using a WYKO NT1100 optical profilometer in vertical scanning interferometry (VSI) mode. For the cross sectional investigations, the coatings were mounted on stubs using double-sided carbon tape, and sputter coated with platinum, using a Emitech K575X sputter coating unit, to prevent surface charging by the electron beam. Samples were then examined using a FEI Quanta 3D FEG DualBeam (FEI Ltd, Hillsboro, USA). X-ray Diffraction (XRD) measurements were carried out using a Siemens D500 diffractometer operating at 40 kV and 30 mA with Cu K$\alpha$ radiation in normal diffraction mode at 0.2°/min scan rate.

Dye Sensitization, UV-vis Measurements and IV-Characteristics

NiOx coatings were sensitized with 0.3 mM Erythrosin B (ERY) dye, in a 99.8% ethanol solution for 24 h. The dye adsorption was investigated in transmission mode using an AnalytikJena Specord 210 UV-vis spectrophotometer in the wavelength range of 350-700 nm. The photovoltaic performance (I-V characteristic) of dye sensitized NiOx coatings were analyzed in two electrode configuration using 870 W m$^{-2}$ AM 1.5 solar simulator and platinum coated FTO was used as a counter electrode. The p-type behavior of ERY-sensitized NiOx coatings was observed using a custom made photoelectrochemical cell in three-electrode configuration: Working electrode was ERY-NiOx on FTO; counter electrode was platinum, where SCE was utilized as a reference electrode. The Electrolyte was 0.5 M LiI and 0.05 M I$_2$ in Propylene Carbonate (from Sigma-Aldrich).

Results and Discussion

Loosely adherent NiOx particulate layers were prepared from the metal oxide/methanol slurry using the spray technique described above. The layer thickness was maintained between 1-2 μm.

Figure 2:
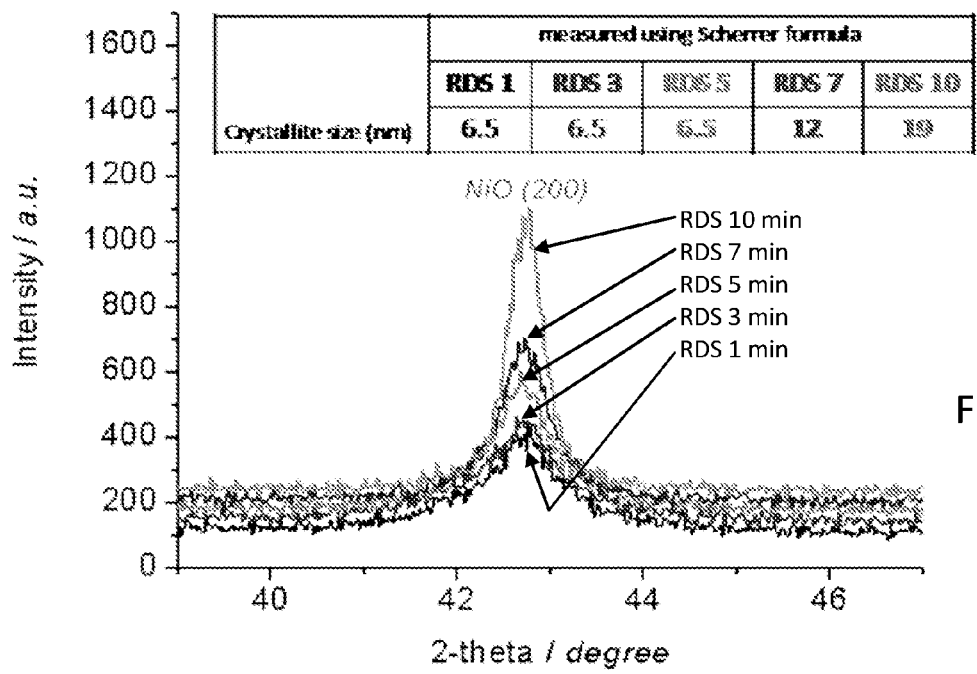
FIG. 2 shows the XRD spectra of various samples of microwave plasma sintered NiOx coatings, sintered for between 1 and 10 minutes from which crystallite size information was calculated using the Scherrer equation.

Referring to FIG. 2, the effect of sintering time on crystallite size was evaluated for samples sintered from 1 to 10 minutes using the microwave plasma sintering technique described above, prior to addition of the dye. For brevity, this microwave plasma sintering technique is referred to as "rapid discharge sintering" or "RDS". FIG. 2 shows the X-ray diffraction data in the NiO (200) plane for samples sintered for 1, 3, 5, 7 and 10 minutes.

Using the Scherrer equation to examine the XRD data, an increase in crystallite size from 6.5 to 19.0 nm was observed on increasing the sintering time from 1 to 10 minutes. The Scherrer formula gave a crystallite size of 6.5 nm for each of the samples sintered for 1 minute, 3 minutes and 5 minutes. For the sample sintered at 7 minutes the crystallite size was calculated at 12 nm, while for 10 minutes the size was 19 nm.

Figure 3:
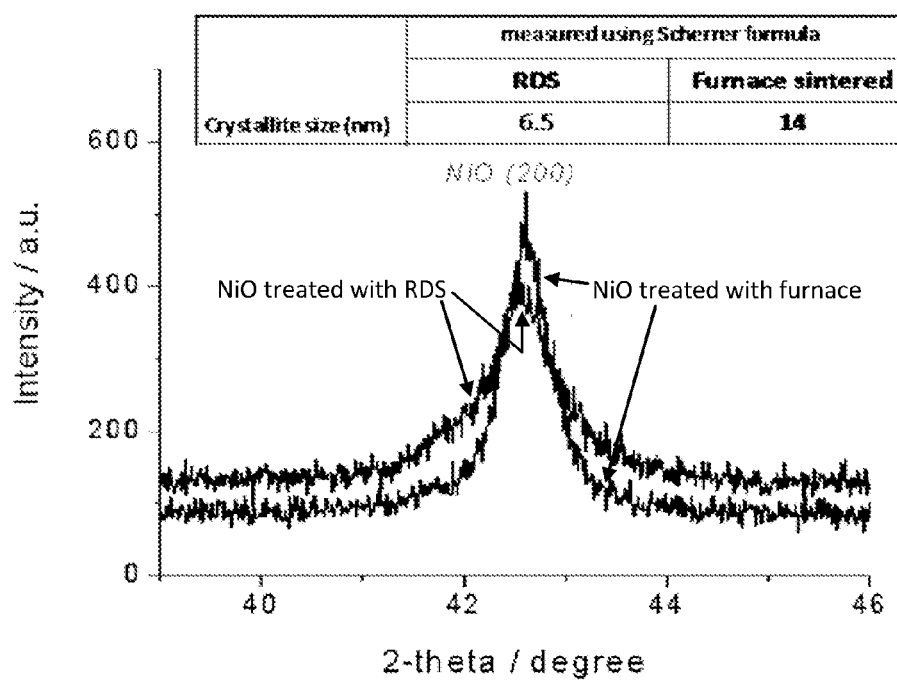
FIG. 3 shows the comparative XRD spectra of NiOx coatings sintered for 5 minutes using a furnace and using the microwave plasma technique, from which crystallite size information was calculated using the Scherrer equation.

Referring to FIG. 3, in order to compare the performance of RDS technique with conventional furnace treatments, the NiOx coatings were also sintered at 450° C. for 5 minutes in a box furnace. The properties of the furnace sintered coatings were then compared with those obtained using the RDS technique. XRD examination of the sintered NiOx coatings demonstrated a significantly smaller crystallite size of 6.5 nm for the microwave plasma sintered samples, as compared to the 14 nm obtained after the furnace treatment. Thus the smaller grain size along with more homogeneous heating/sintering is achieved using the RDS technique thus helping to maintain the mesoporous structure of the NiOx nanoparticles.

Figure 4:
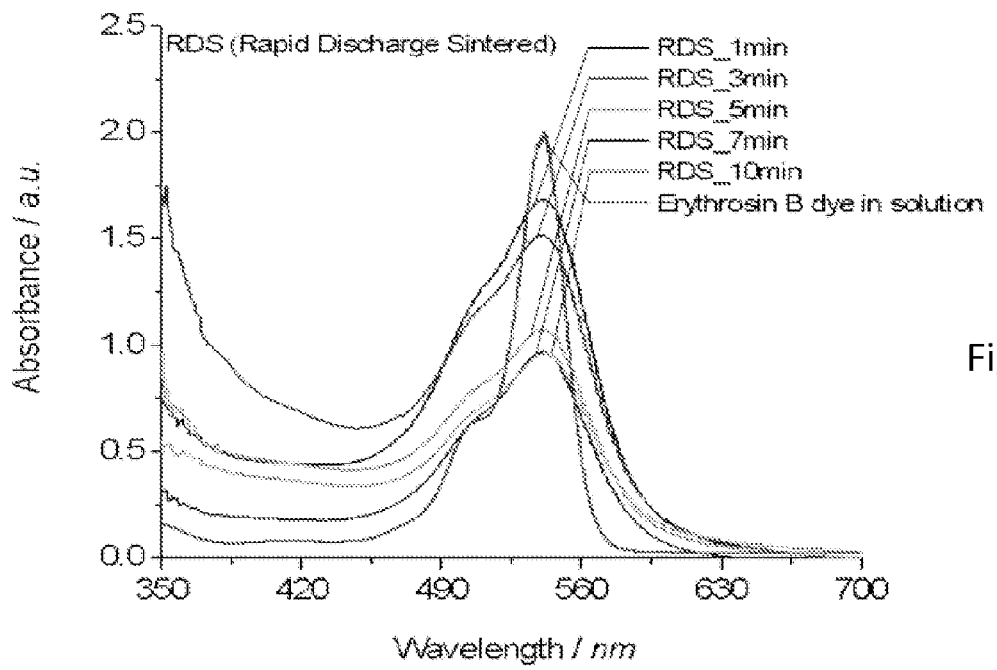
FIG. 4 is a plot of the UV-vis absorbance spectroscopy of the microwave plasma sintered samples from FIG. 2 (treated for between 1 and 10 minutes), after having been dye sensitized with Erythrosin B.

Referring to FIG. 4, after treatment of the RDS samples with the ERY-B dye, the UV-vis absorption spectra of the samples prepared under different sintering times showed a gradual decrease of the amount of adsorbed dye for the coatings with the smaller crystallite size to those with the largest crystallites. The line with the highest peak in FIG. 4 is the reference of the ERY-B dye in solution.

Figure 5:
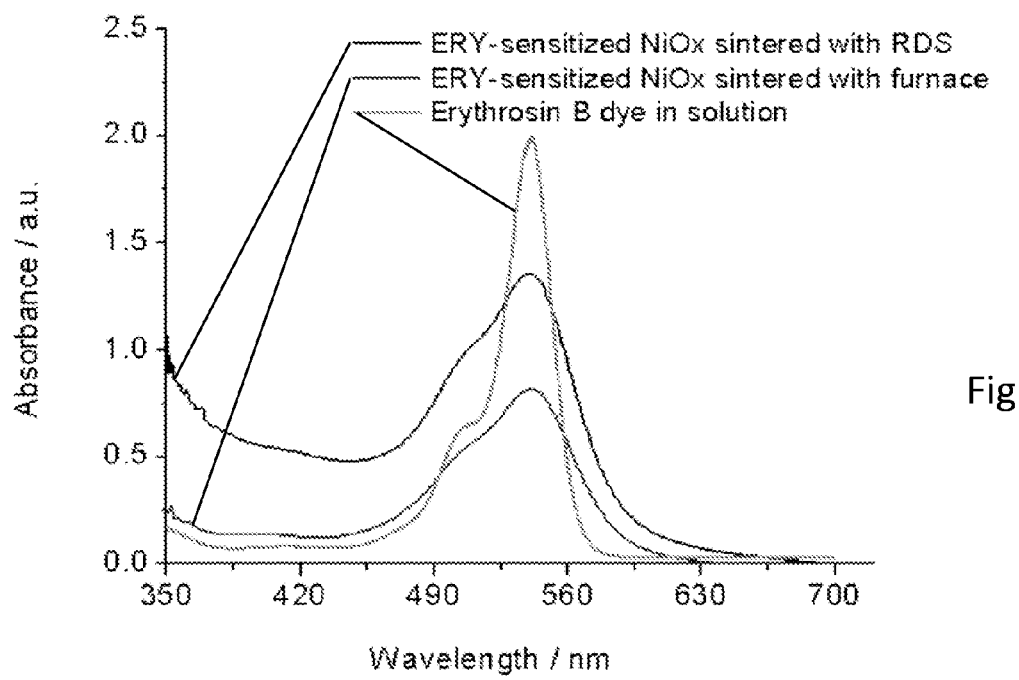
FIG. 5 is a comparative plot of the UV-vis absorbance spectroscopy for dye-sensitized NiOx coatings sintered for 5 minutes using a furnace and using the microwave plasma technique.

Referring to FIG. 5, comparative data can be seen for the 5 minute RDS sample and the 5 minute furnace sintered sample. Again the reference is shown for ERY-B solution. From this it can be seen that the RDS sample has a far greater degree of dye absorption, probably due to rougher surface morphology.

Figure 6:
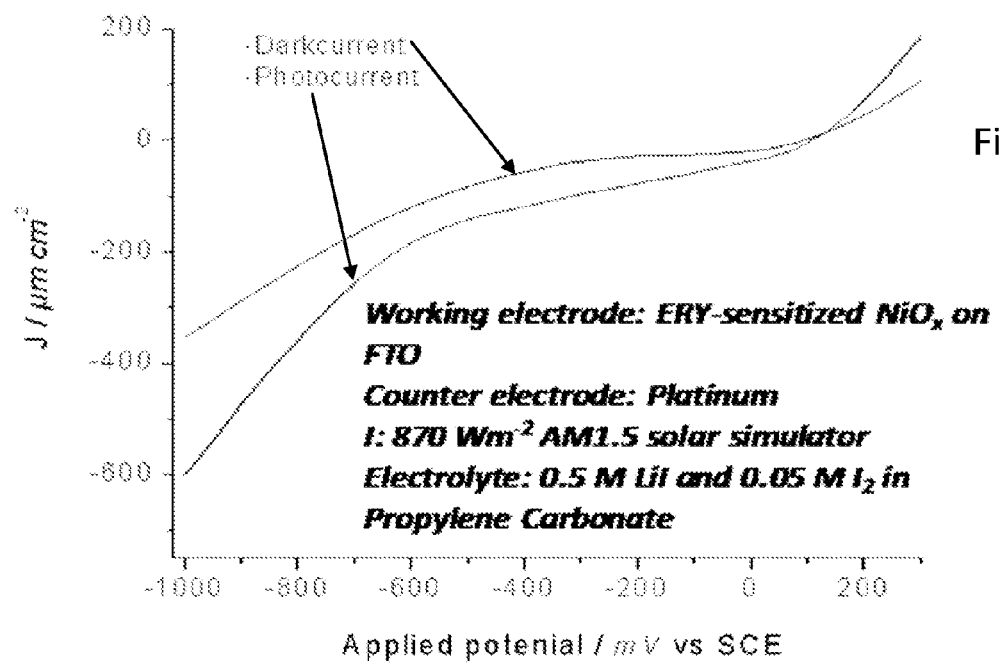
FIG. 6 shows the current density vs. applied potential curves for 5 minute RDS sintered NiOx coatings sensitized with ERY.

FIG. 6 shows the p-type behavior of ERY-sensitized NiOx coatings (RDS5). The curves in dark and under UV illumination demonstrated cathodic photocurrents of ERY-sensitized NiOx coatings with an onset of photocurrent at approximately +120 mV vs. SCE reference.

Figure 7:
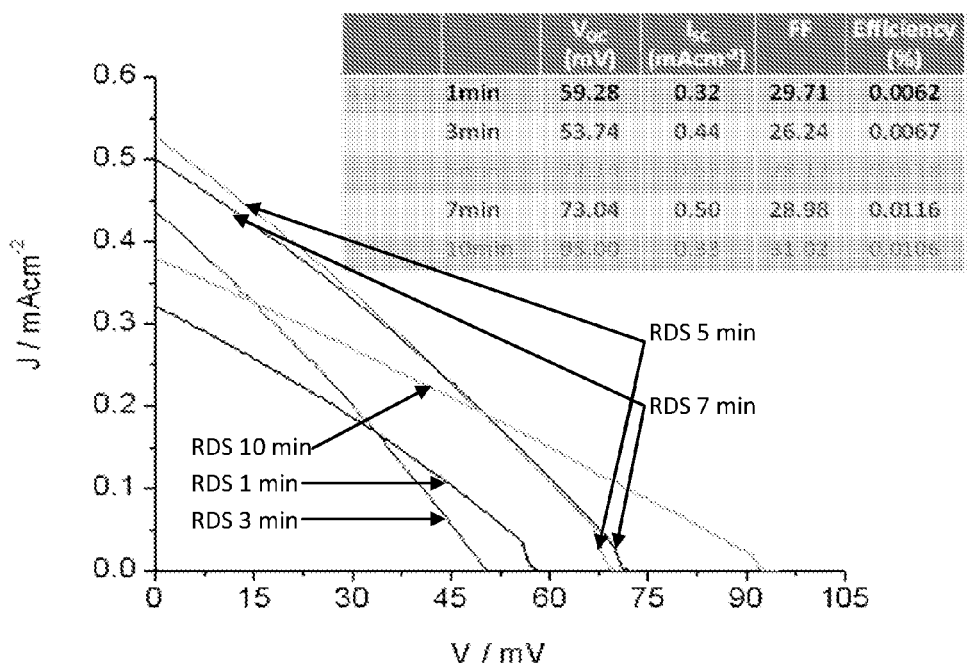
FIG. 7 shows the photovoltaic performance of ERY sensitized NiOx coatings when assembled in a photovoltaic cell and measured under standard conditions using an AM 1.5 solar simulator (I: 870 W m$^{-2}$)

Next, the open current photovoltage ($V_{OC}$), the short circuit photocurrent density ($I_{SC}$) and overall photocurrent efficiency ($\eta$), were measured as a function of sintering time. FIG. 7 details the I-V characteristics of the ERY sensitized NiOx coatings sintered at different times (thickness: 1-2 μm). Though dye adsorption levels were higher for the 1 minute sintered coatings, the 5 minutes sintered sample (RDS5) exhibited the highest efficiency. These sintering conditions facilitate a high level of dye diffusion, while maintaining interconnectivity between individual oxide grains. Thus the mesoporous sintered metal oxide structure facilitates efficient charge injection from the ERY dye. A subsequent study with 2.5 μm thick NiOx coatings also demonstrated a similar trend.

Figure 8:
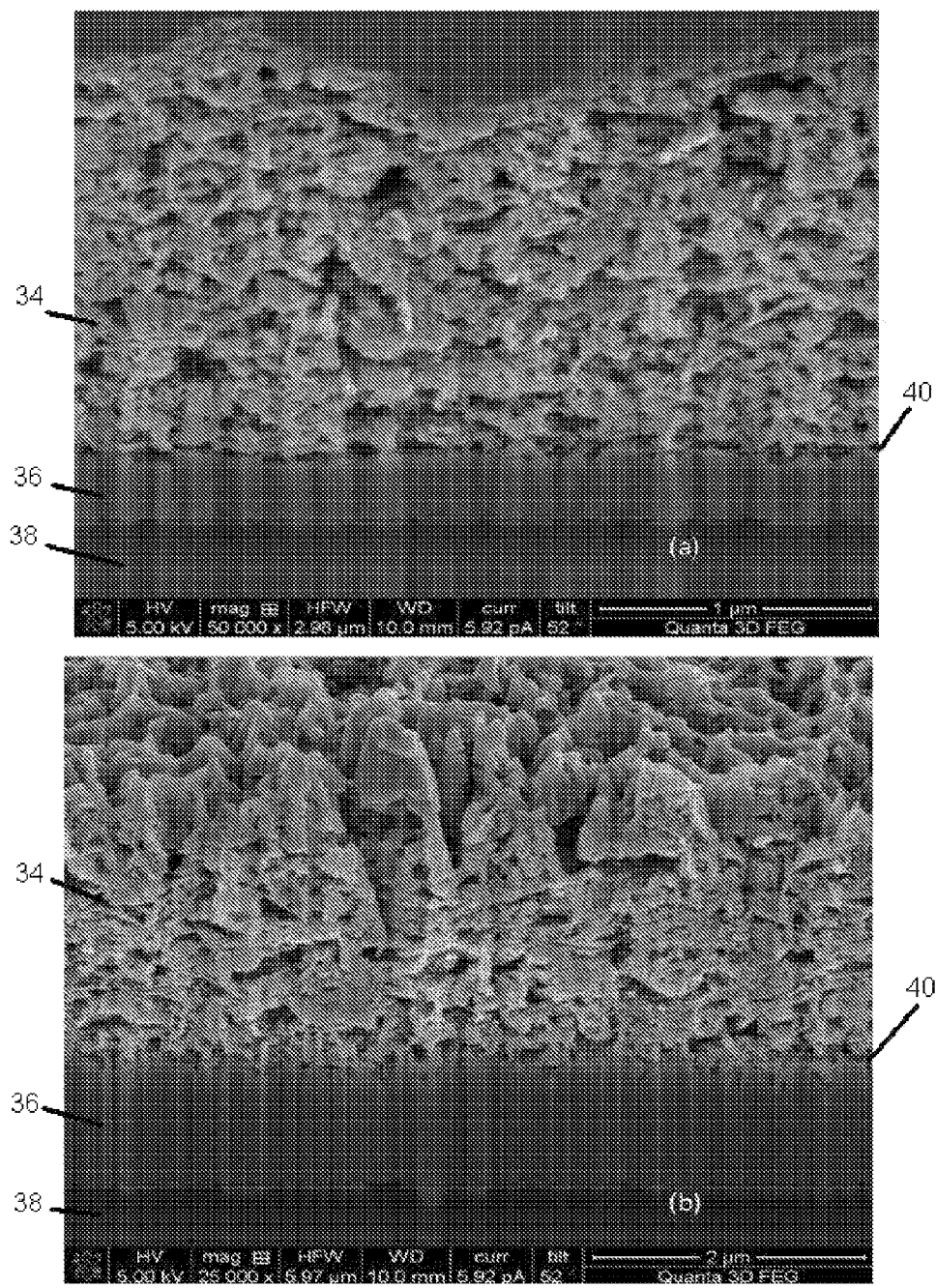
FIG. 8(a) shows the FIB-SEM cross-section image of the NiOx sample sintered for 5 minutes in a furnace.
FIG. 8(b) shows the FIB-SEM cross-section image of the NiOx sample sintered for 5 minutes in the microwave plasma apparatus.

FIG. 8 shows focused ion beam/scanning electron microscope (FIB/SEM) cross section images of NiOx coatings obtained after 5 minute sintering using (a) the furnace and (b) microwave plasma. In each image, one can see the sintered NiOx layer 34, the FTO layer 36, and the underlying glass substrate 38. It is clear from these images that the RDS sintered coating exhibits a higher level of bonding at the interface 40 between the NiOx coating and FTO layer, as seen by the elimination of the dark gap seen a this interface in FIG. 8(b). A possible explanation for this is that the RDS treatment involves volumetric heating, which provides more effective heating inside the metal oxide coating matrix than obtained with the conductive heating obtained using the furnace. Indeed the latter treatment may give rise to selective heating of the outer surface of a coating to produce a heat affected zone [37]. From FIG. 8 it is also clear that the RDS sintered oxide yields a much rougher surface morphology, which would also assist dye adsorption (FIG. 3b).

Finally, the photovoltaic performances (open circuit voltage, short circuit current, fill factor, and percent efficiency of both RDS5 and CS5 (i.e. the notation CS5 denotes the 5 minutes furnace sintered sample) coatings were measured as detailed in Table 1, and comparative values are given for two of the best performing electrodes as reported in the literature, namely He et al. [J. He, H. Lindström, A. Hagfeldt, S.-E. Lindquist, Solar Energy Materials and Solar Cells, 62 (2000) 265-273] and Nattestad et al. [A. Nattestad, M. Ferguson, R. Kerr, Y-B. Cheng, U. Bach, Nanotechnology, 19 (2008) 295-304]. The measurements carried out by He and by Nattestad were also obtained under the same test methodology. The Nattestad results were obtained using the dye Erythrosin-J rather than the Erythrosin-B The furnace sintered coatings reported here are broadly similar in efficiency to the values reported in the literature while those obtained with the RDS treatment exhibit significantly higher performance, i.e. a tenfold increase of conversion efficiency was observed for the 5 minute RDS sintered NiOx coatings as compared to the 5 minute furnace sintered sample. Results are given in Table 1 for samples sintered in the furnace for both 5 minutes (CS5) and 30 minutes (CS30).

| Sample (NiO thickness) | Sintering time (min.) | $V_{OC}$ (mV) | $I_{SC}$ (mAcm$^{-2}$) | FF | Efficiency (%) |
|---|---|---|---|---|---|
| Rapid Discharge Sintered (RDS5) (~2.5 μm thick) | 5 | 120.00 | 1.05 | 36 | 0.0450 |
| Furnace Sintered (CS5) (~2.5 μm thick) | 5 | 84.00 | 0.22 | 25 | 0.0050 |
| Furnace Sintered (CS30) (~2.5 μm thick) | 30 | 35.29 | 0.21 | 26 | 0.0023 |
| He et al. (~1 μm thick) | 60 | 83.00 | 0.20 | 27 | 0.0070 |
| Nattestad et al. (~1.6 μm thick) | 20 | 120.00 | 0.36 | 26 | 0.0110 |

Preparation of n-Type Electrode

An n-type electrode based on titanium dioxide and ERY-B was made according to the same techniques as described above. Using the same FTO glass substrates, a deposition layer slurry was created using titanium dioxide nanoparticles ("Aerosil® P 25" from Evonik Industries) having an average particle size of 21 nm, and methanol (25 mg/ml). This mixture was again sprayed on the glass substrate using a nebulizer, in this case in a layer 9 microns thick, and samples were subjected to both conventional and microwave plasma sintering.

Figure 9:
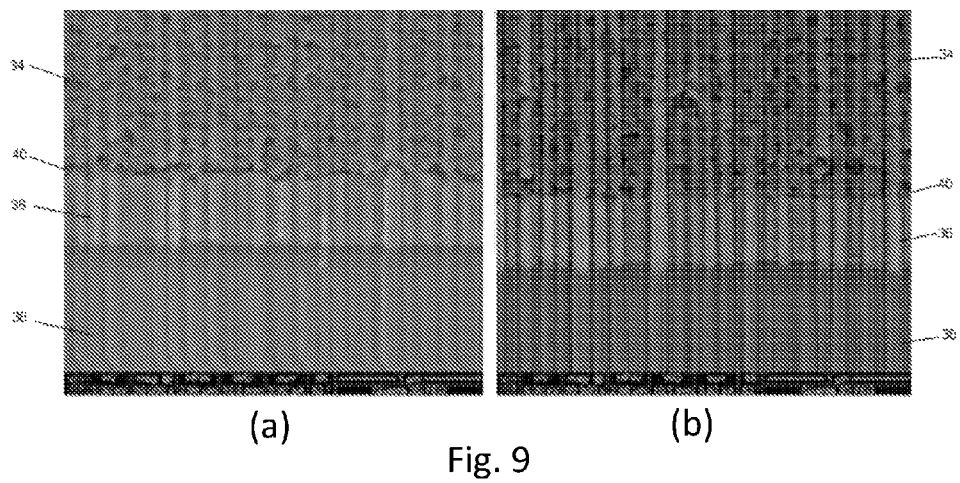
FIG. 9(a) shows the FIB-SEM cross-section image of a TiO$_2$ sample sintered for 30 minutes in a furnace.
FIG. 9(b) shows the FIB-SEM cross-section image of a TiO$_2$ sample sintered for 5 minutes in the microwave plasma apparatus.

FIG. 9 shows comparative FIB-SEM cross-section images for (a) conventionally sintered (at 500 degrees C. for 30 minutes) and (b) microwave plasma sintered samples sintered for 5 minutes.

The SEM images again show the layers designated with the same reference numerals: sintered TiO2 layer 34, FTO layer 36, glass 38 and the interface 40 between the sintered TiO2 and the FTO substrate. As with the NiOx samples described above, one can again see that the RDS sample in FIG. 9(b) exhibit far less of a gap at interface 40, which strongly indicates better electrical connectivity and structural integrity relative to the CS sample in FIG. 9(a).

Accordingly, the technique of applying to a substrate a deposition layer including semiconductor particles, removing the dispersion medium, and then exposing the weakly bound particle layer to a microwave plasma under conditions leading to sintering of the particles, gives rise to a mesoporous semiconductor layer which is strongly bound with good electrical connectivity to the underlying substrate, and this has been demonstrated both for n-type TiO2 and p-type NiOx.

In the case of the NiOx photocathodes, using the materials and methods described herein it can be seen that a 5 minute microwave plasma treatment cycle provides optimal conversion efficiency, and improved adhesion to FTO substrates compared with that obtained using furnace treatments. The 44% increase in the quantity of adsorbed dye in the case of the RDS treated coatings significantly contributed to the tenfold increase in light-to-current conversion efficiency, compared with that obtained with the furnace sintered coatings. This enhanced performance of the microwave plasma sintered coatings is associated with their smaller grain size after sintering, higher surface roughness and enhanced level of interconnectivity between grains in the mesoporous metal oxide structure.

Figure 10:
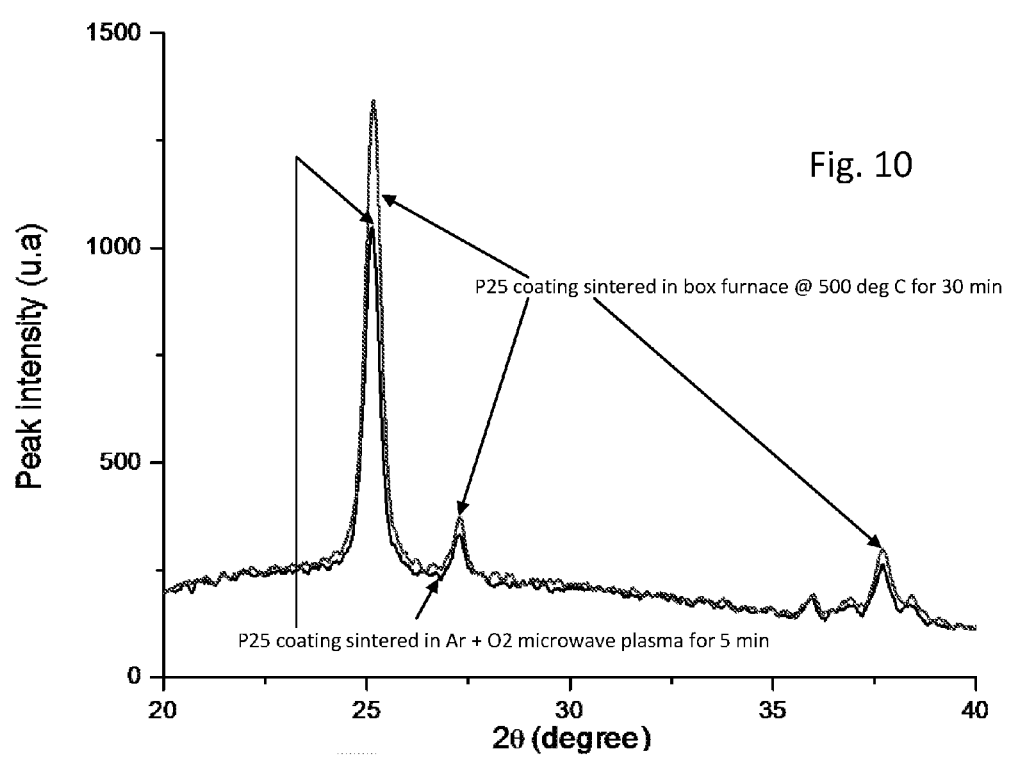
FIG. 10 shows the comparative XRD spectra of TiO2 coatings sintered for 5 minutes using the microwave plasma technique and for 30 minutes using a furnace at 500 degrees C.
Figure 15:
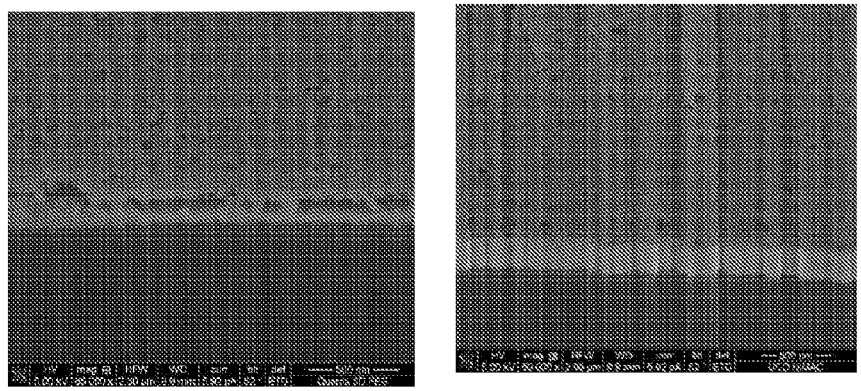
FIG. 15 shows a cross-sectional comparative analysis of the adhesion between a TiO2 coating and a substrate when deposited without TIP and when TIP is used as a co-depositing layer.

FIG. 10 shows the comparative XRD spectra of the box furnace treated and microwave plasma treated TiO2 coatings, and it can be seen that both exhibit very similar XRD spectra.

EXAMPLE 2

TiO$_2$ Nanoparticles on Flexible Polymeric Substrate

Sample Preparation

Degussa P25 TiO$_2$ nanoparticles with an average size between 20-25 nm were deposited on ITO-PEN coated substrate (where ITO stands for indium doped tin oxide and PEN for polyethylene naphthalate). The TiO$_2$ was prepared in a suspension form by grinding the nanoparticles powder in an alumina mortar in order to breakdown the agglomerated particles. The ground paste was then transferred into a recipient using methanol solvent vehicle and diluted to a final concentration of 25-30 mg/ml and further sonicated using a sonication horn probe.

The TiO$_2$ suspension was applied to the plastic substrate using a roll-to-roll spraying technique. In this technique the suspension is pumped through a nebulizer, shown in FIG. 11, and with the assistance of a pressurised gas (nitrogen) is atomised and projected at the surface of the plastic substrate mounted onto a CNC controlled (X-Y-Z) pneumatic table.

In addition to the TiO$_2$ suspension, a second suspension consisting of titanium isopropoxide (TIP) (20-25 mmol/l) precursor in propan-2-ol was co-applied using a second nebuliser.

The titanium isopropoxide (TIP) is used to enhance the adhesion of the TiO$_2$ coating to the plastic substrate.

The thickness of the TiO$_2$ coating (varying between 4 to 10 µm) is controlled by the amount of TiO$_2$ in the suspension and/or the number of passes of the nebuliser over the substrate.

In the tests described below and illustrated with reference to FIGS. 12-19 the TiO$_2$ coatings had a thickness between 4 and 6 microns. This thickness will influence solar to electricity conversion efficiency due to parameters such as the electron transport properties of the coating structure. Also, the quantity of dye adsorbed will be influenced by the TiO$_2$ coating thickness.

After the coating deposition the samples were allowed to relax for approx. 20 minutes to thoroughly evaporate the carrying vehicle, leaving the powdered semiconductor particles in a deposition layer on the substrate.

Microwave Plasma Processing and Morphological Analysis

Sintering of the dried TiO$_2$ coatings was then carried out in oxygen plasma generated using a 2.45 GHz microwave generator. The plasma gas pressure was maintained between 4-5 mbar with a sample treatment time of 5 minutes.

The plasma processing apparatus was as shown and as previously described in relation to FIG. 1, except that oxygen plasma was employed at 4-5 mbar instead of a 10:1 argon: oxygen mixture at 20 mbar (although argon:oxygen mixtures or other plasmas could equally be employed), and (2) a mask was overlaid on the sample as described below.

The samples were held on the cooling stage of the microwave system using a mask (in this case a 1 mm thick glass slide) to ensure its flatness and intimate contact with the stage as illustrated in FIG. 12.

The presence of the cooling stage ensures the integrity of the polymeric substrate; as shown in FIG. 13 the use of an intermediate sample holder (in this case a glass cover as thin as 0.5 mm in thickness) resulted in melting the polymer. This is an indication that the plasma gas temperature exceeded 270-300° C. (as the melting temperature of PEN is reported to be 270° C.—see E. L. Bedia, S. Murakami, T. Kidate and S. Kohjiya; Polymer 42 (2001) 7299-7305).

FIG. 14 shows results of the TiO$_2$ coatings subjected to Rockwell hardness test and bending tests. The coatings were found to easily flake off after indentation was applied to the substrate without the use of TIP precursor (FIG. 14$a$) whereas stability was greatly improved in the same test carried out on a sample prepared with TIP precursor (FIG. 14$b$). As shown in FIGS. 14$c$, 14$d$ and 14$e$, the use of TIP in the deposition process significantly improved the stability of the TiO$_2$ coating on the substrate both in initial condition (FIG. 14$c$) and when bent through 20 degrees (FIG. 14$d$) and 40 degrees (FIG. 14$e$).

The coatings were also evaluated using both High resolution scanning electron microscopy (HRSEM) and focus ion beam (FIB) cross sectional analysis. These analyses further confirmed the weakened nature of the adhesion of the TiO$_2$ coating deposited without TIP and its intimate contact with the substrate when TIP is used as a co-depositing layer (see FIG. 15).

Figure 16:
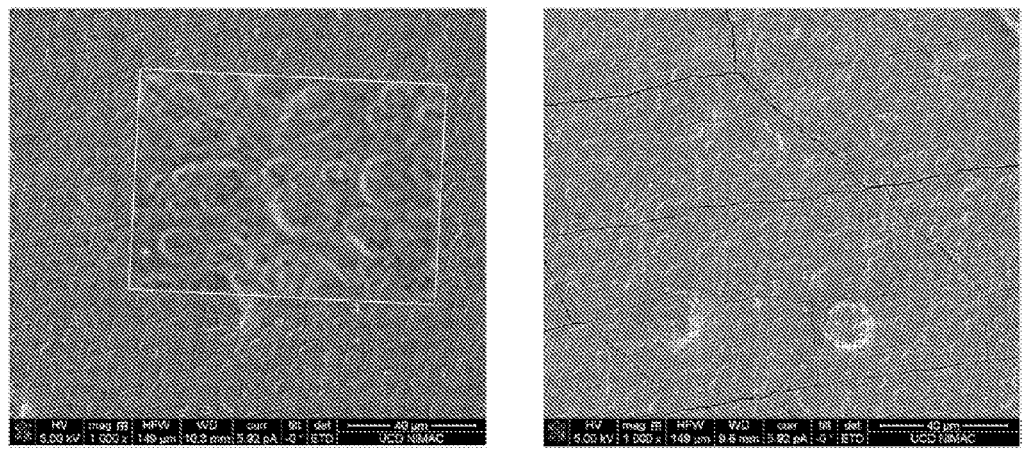
FIG. 16 is a pair of SEM micrographs of the top surface of TiO$_2$ coatings after deposition and after subsequent plasma treatment.

The SEM micrograph of the top surface of the TiO$_2$ coatings indicated micro-crack formation in the coating when deposited on the plastic substrate (FIG. 16). This may be related to the spraying parameters and may be eliminated or significantly reduce by further optimisation of the deposition parameters.

Electrical Characterization

Further to the morphological analysis of the TiO$_2$ coating, the photovoltaic performance was assessed by assembling DSSC's and recording their current-voltage (IV) characteristics.

Figure 17:
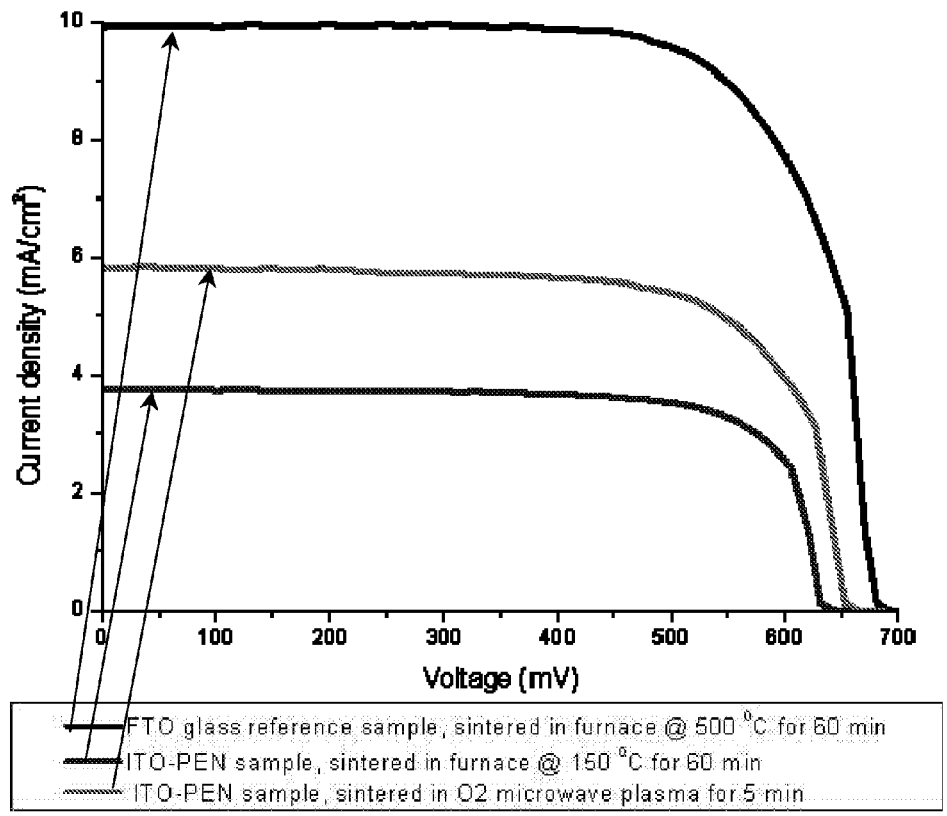
FIG. 17 shows the IV curves of TiO$_2$ coatings on ITO-PEN substrates when subjected to different sintering techniques and when compared with TiO$_2$ coating on an FTO-glass substrate.

FIG. 17 shows the IV curve of TiO$_2$ coatings on ITO-PEN substrates sintered in microwave plasma for 5 minutes or a conventional furnace for 60 minutes at 150° C. The IV curve of a TiO$_2$ coating on an FTO-glass substrate sintered at 500° C. for 60 minutes is also shown.

Table 2 compares the conversion efficiency ($\eta$) of the same coatings. It is found that the PEN samples sintered in the microwave plasma exhibit 30-35% higher conversion efficiencies when compared to the one sintered in the furnace while it reaches 60% of the conversion efficiencies obtained on the FTO-glass substrate.

|  | Glass | PEN Furnace | PEN Microwave |
|---|---|---|---|
| Conversion Efficiency $\eta$ (%) | 5.68 | 2.08 | 3.15 |

Furthermore the overall processing cycle time of the samples in the microwave system is only 10-15 minutes including the time taken for loading/unloading of the samples and pumping down of the system.

Figure 18:
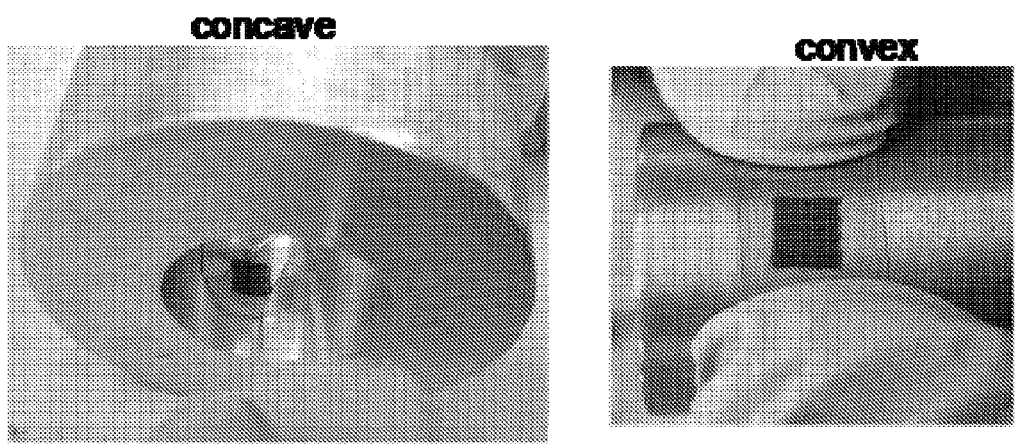
FIG. 18 is a photographic illustration of the flex test method.

FIG. 18 is a more detailed illustration of the steps involved in the flexing test, showing that a flex involved conforming the substrate and coating to both the interior (concave) surface of an annular cylinder and to the outer (convex) surface.

Figure 19:
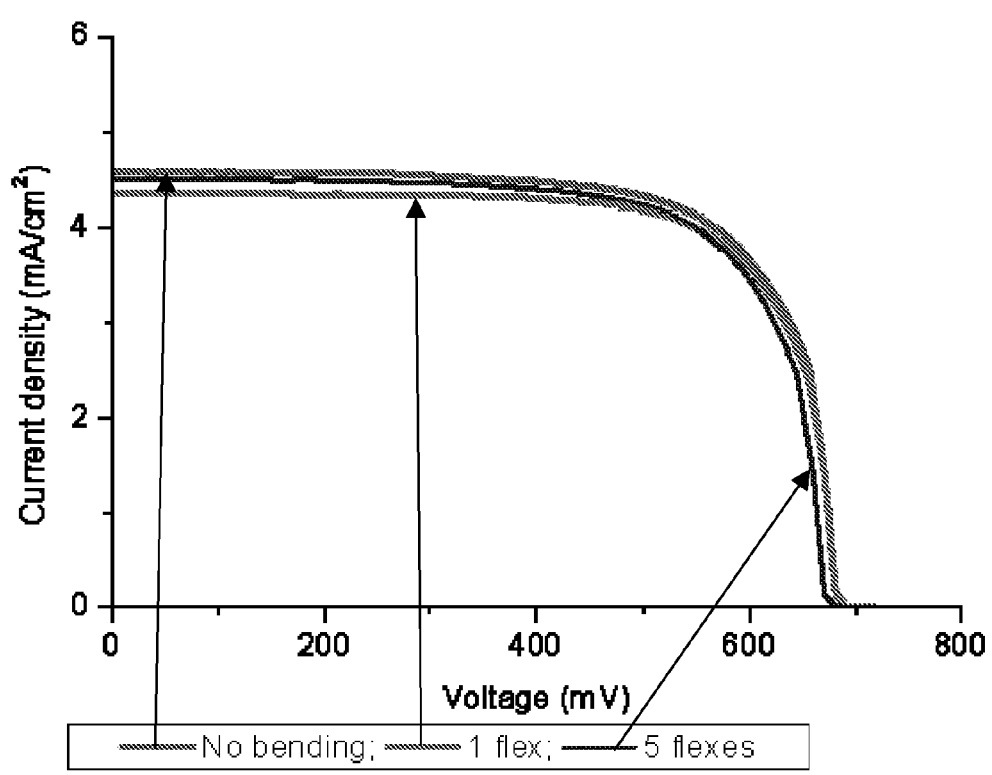
FIG. 19 shows the IV curves of cells of dyed TiO$_2$ coatings which had been previously subjected to repeated bending at 20 degrees before assembly of the cells.

FIG. 19 shows the IV curves of cells of dyed $TiO_2$ coatings subjected to repeated bending at 20° (as illustrated in FIG. 18) before assembling the cell. It is found that the bending does not alter the IV characteristics of the coatings.

The invention claimed is:

1. A method of manufacturing a photovoltaic electrode, comprising the steps of:
    (a) depositing on a substrate a dispersion comprising powdered semiconductor particles in a dispersion medium;
    (b) removing the majority of the dispersion medium to leave the powdered semiconductor particles in a deposition layer on the substrate;
    (c) creating a plasma using microwave energy excitation;
    (d) exposing the deposition layer to said microwave-excited plasma for a sufficient time to sinter the nanoparticles thereby adhering them to the substrate; and
    (e) absorbing a dye into said sintered deposition layer.

2. The method of claim 1, wherein step (a) of depositing a deposition layer comprises depositing a layer of said powdered semiconductor particles in a dispersion medium, and removing a majority of said dispersion medium to leave the particles weakly bound to the substrate in a deposition layer.

3. The method of claim 1, wherein said deposition step is selected from spraying, spin coating and sol gel deposition.

4. The method of claim 2, wherein the dispersion medium is heated before, during or after the deposition step to evaporate the dispersion medium.

5. The method of claim 4, wherein the heating of the dispersion medium is achieved by heating the substrate.

6. The method of claim 1, wherein said powdered semiconductor particles have a maximum particle size of 20 microns.

7. The method of claim 1, wherein said powdered semiconductor particles have a maximum particle size of 500 nm.

8. The method of claim 1, wherein said powdered semiconductor particles are nanoparticles with a maximum particle size of 100 nm.

9. The method of claim 1, wherein said powdered semiconductor particles are metal oxide particles.

10. The method of claim 9, wherein said metal oxide particles are selected from nickel oxide, titanium dioxide, tin oxide, indium tin oxide and zinc oxide.

11. The method of claim 1, wherein said dye is Erythrosin B dye (2',4',5',7'-tetraiodofluorescein, disodium salt).

12. The method of claim 1, wherein in step (c), the deposition layer is exposed to said microwave plasma for between 2 and 20 minutes.

13. The method of claim 1, wherein in step (c), the deposition layer is exposed to said microwave plasma for between 4 and 15 minutes.

14. The method of claim 1, further comprising the step of depositing on the substrate an adhesion enhancing agent to enhance adhesion between the semiconductor particles and the substrate.

15. The method of claim 14, wherein the adhesion enhancing agent is a metal compound which is reactive in the presence of water vapour to form a metal oxide.

16. The method of claim 15, wherein said semiconductor particles comprise the same metal oxide as is formed by the reaction of said metal compound with water vapour.

17. The method of claim 16, wherein the metal oxide is selected from nickel oxide, titanium dioxide, tin oxide, indium tin oxide and zinc oxide.

18. The method of claim 15, wherein the metal compound is a metal alkoxide or metal halide of the same metal as is present in said metal oxide with the proviso that the metal alkoxide or metal halide is reactive in the presence of water vapour to form said metal oxide.

19. The method of claim 18, wherein the metal oxide is titanium dioxide, and the compound is selected from the group of titanium tetrachloride, titanium alkoxides (including in particular titanium isopropoxide and titanium butoxide) and precursors thereof.

20. The method of claim 14, wherein the adhesion enhancing agent is dispersed in an organic carrier which is substantially free of water.

21. The method of claim 20, wherein said organic carrier is selected from isopropanol, tertbutanol and mixtures thereof.

22. The method of claim 20, further comprising the step of causing said organic carrier to evaporate in the presence of water vapour in the air, thereby causing said metal compound to react with said water vapour to form an amorphous layer of metal oxide.

23. The method of claim 14, wherein said step of depositing an adhesion enhancing agent occurs prior to step (a) of depositing on the substrate a dispersion comprising powdered semiconductor particles in a dispersion medium.

24. The method of claim 14, wherein the adhesion enhancing agent is co-deposited with the semiconductor nanoparticles in the same dispersion medium, such that said step of depositing an adhesion enhancing agent occurs as part of the deposition step (a).

25. The method of claim 14, wherein the adhesion enhancing agent is deposited on the substrate in a first layer together with the semiconductor nanoparticles, following which a layer of semiconductor nanoparticles is deposited without adhesion enhancing agent.

26. The method of claim 23, wherein said deposition steps are repeated to provide a sandwich structure of layers.

* * * * *